United States Patent
Wiscombe et al.

(10) Patent No.: US 11,468,939 B2
(45) Date of Patent: Oct. 11, 2022

(54) CONDITIONAL ROW ACTIVATION AND ACCESS DURING REFRESH FOR MEMORY DEVICES AND ASSOCIATED METHODS AND SYSTEMS

(71) Applicant: Micron Technology, Inc., Boise, ID (US)

(72) Inventors: Miles S. Wiscombe, Boise, ID (US); Debra M. Bell, Boise, ID (US); Brian T. Pecha, Boise, ID (US); Vaughn N. Johnson, Boise, ID (US); Kyle Alexander, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/107,306

(22) Filed: Nov. 30, 2020

(65) Prior Publication Data

US 2022/0172771 A1    Jun. 2, 2022

(51) Int. Cl.
*G11C 7/00* (2006.01)
*G11C 11/406* (2006.01)
*G11C 11/408* (2006.01)

(52) U.S. Cl.
CPC .... *G11C 11/40615* (2013.01); *G11C 11/4085* (2013.01)

(58) Field of Classification Search
CPC .................................. G11C 11/40615

USPC ........................................... 365/222
See application file for complete search history.

(56) References Cited

U.S. PATENT DOCUMENTS

| 10,061,541 | B1 * | 8/2018 | Lee | G11C 7/10 |
|---|---|---|---|---|
| 2004/0117723 | A1 * | 6/2004 | Foss | G06F 11/1044 |
| | | | | 714/805 |
| 2016/0163377 | A1 * | 6/2016 | Oh | G11C 11/40618 |
| | | | | 365/222 |
| 2017/0140810 | A1 * | 5/2017 | Choi | G11C 11/40607 |
| 2019/0066766 | A1 * | 2/2019 | Lee | G11C 11/408 |
| 2019/0348100 | A1 * | 11/2019 | Smith | G11C 29/804 |

* cited by examiner

*Primary Examiner* — Hoai V Ho
(74) *Attorney, Agent, or Firm* — Perkins Coie LLP

(57) ABSTRACT

Memory devices, systems including memory devices, and methods of operating memory devices are described, in which memory devices are configured to conditionally activate certain rows during refresh operations such that the memory devices can execute operations directed to the activated rows concurrently with the refresh operations. In some embodiments, the memory device receives an activate (ACT) command directed to a section of a memory bank while performing refresh operations for the memory bank. The memory device may carry out the ACT command if certain conditions are satisfied not to corrupt the data being refreshed. Subsequently, the memory device generates a signal to indicate the ACT command has been accepted to activate a row identified by the ACT command. Further, the memory device can perform subsequent access commands directed to the row, in parallel with the refresh operations.

20 Claims, 4 Drawing Sheets

CONDITIONAL ROW ACTIVATION AND ACCESS DURING REFRESH FOR MEMORY DEVICES AND ASSOCIATED METHODS AND SYSTEMS

TECHNICAL FIELD

The present disclosure generally relates to memory devices, and more particularly relates to conditional row activations and access during refresh for memory devices and associated methods and systems.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and nonvolatile memory. Volatile memory, including random-access memory (RAM), static random-access memory (SRAM), dynamic random-access memory (DRAM), and synchronous dynamic random-access memory (SDRAM), among others, require a source of applied power to maintain its data. Nonvolatile memory, by contrast, can retain its stored data even when not externally powered. Nonvolatile memory is available in a wide variety of technologies, including flash memory (e.g., NAND and NOR), phase change memory (PCM), ferroelectric random-access memory (FeRAM), resistive random-access memory (RRAM), and magnetic random-access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

The present disclosure will be understood more fully from the detailed description given below and from the accompanying drawings of various embodiments of the disclosure. The components in the drawings are not necessarily to scale. Instead, emphasis is placed on illustrating clearly the principles of the present technology.

DETAILED DESCRIPTION

Figure 1:
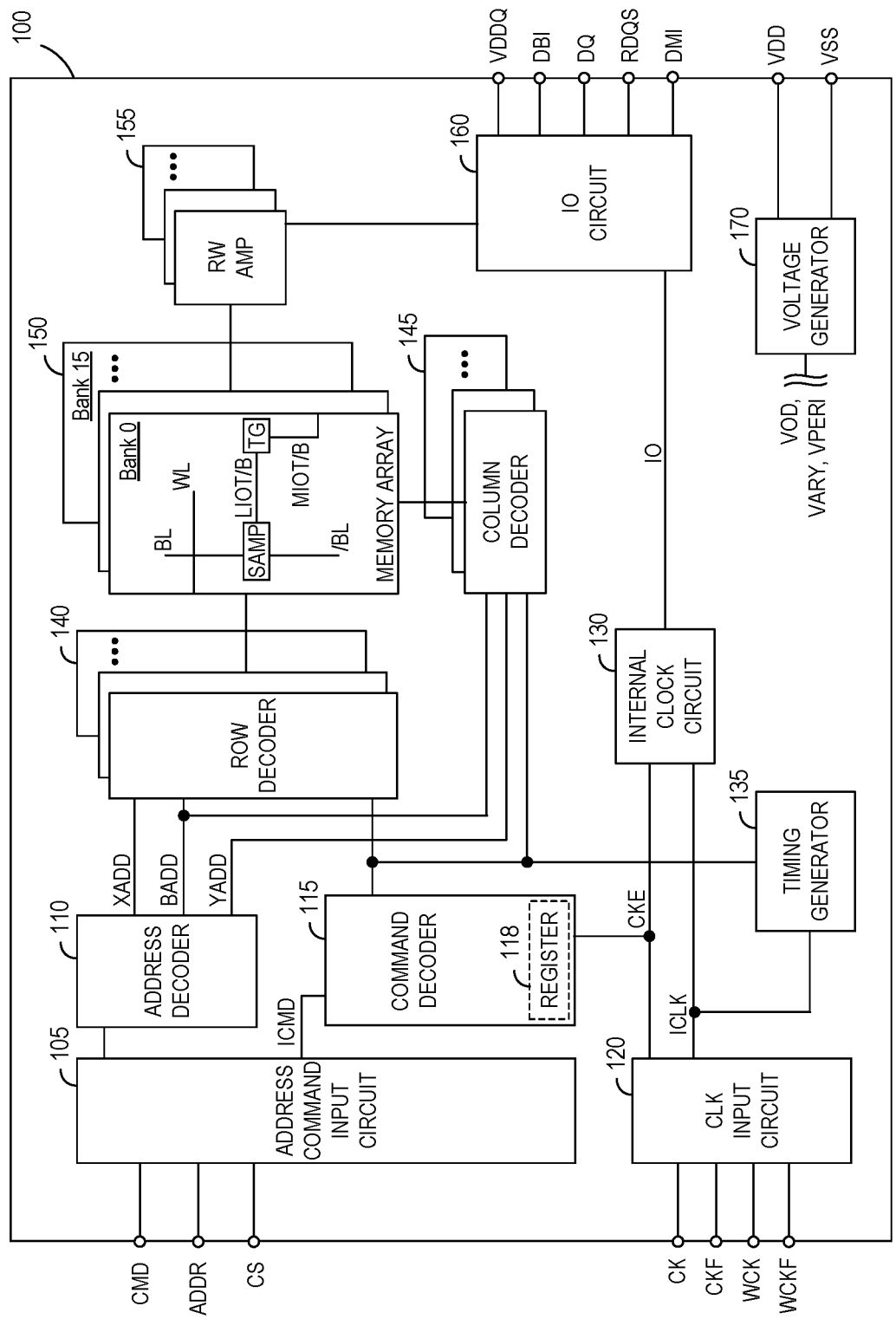
FIG. 1 is a block diagram schematically illustrating a memory device in accordance with embodiments of the present technology.

Methods, systems, and apparatuses for memory devices (e.g., DRAM) are disclosed, which provide conditional row activation and access during refresh operations. Certain semiconductor memory devices, such as DRAM, store data as charge accumulated in cell capacitors ("cells"). The charge accumulated in the cell capacitors may escape (which may be referred to as "leakage") to surrounding components connected to the cell capacitors (e.g., metal lines, semiconductor junctions of transistors) due to voltage differences between the capacitors and the surrounding components. Refresh operations can renew cell charges before they degrade to a point where the charge level no longer corresponds to the original bit value, which may result in bit errors. As such, a host device (e.g., a memory controller) may be required to issue refresh commands regularly to maintain integrity of the data stored in the memory devices.

A refresh command may be associated with a duration (e.g., tRFC) during which the refresh command is executed. In some embodiments, the durations associated with refresh commands are determined based on a memory capacity of the memory device and/or a quantity of memory cells to be refreshed in response to the refresh command—e.g., tRFC1 associated with REFab command for refreshing memory cells of all banks of the memory array, tRFCsb associated with REFsb command for refreshing memory cells of a single bank of the memory array, etc. After a refresh command (e.g., REFab command, REFsb command) is issued, the entire memory device (e.g., for REFab command) or the single bank of the memory device (e.g., for REFsb command) may be blocked for the duration (e.g., tRFC1 for REFab command, tRFCsb for REFsb command) to avoid subsequent operations that could cause data corruption. In some cases, command and/or data bus between the memory devices and the host device may remain idle during the entire tRFC period. As such, overall bandwidths of the memory devices may be reduced due to the durations (e.g., tRFC) associated with the refresh commands, during which the command and/or data bus are not utilized.

Several embodiments of the present technology are directed to improve the overall command and/or data bandwidths of the memory devices by allowing the host device to issue activate (ACT) commands during the tRFC periods after issuing refresh commands—e.g., while the refresh commands are in progress for the single bank or the entire banks of the memory devices. For example, the specification (e.g., data sheets) of the memory devices can describe that, after issuing a refresh command to the memory device, the host device may issue an ACT command to the memory device during the tRFC period associated with the refresh command. Further, the specification can inform the host device to monitor for an indicator signal at predetermined pin(s) of the memory device during a predetermined period of time after issuing the ACT command.

The indicator signal indicates to the host device whether the ACT command has been accepted or not. If the indicator signal indicates that the ACT command has been accepted (e.g., the row of the bank the ACT command is directed to has been activated), the host device may issue commands directed to the row to carry out memory operations associated with the row, in parallel with the refresh operation in progress for the bank. In this manner, the command and/or data bus may be utilized during at least a portion of the tRFC period such that the overall bandwidth of the memory device can be improved.

In this regard, the memory device can be configured to determine whether to perform the ACT commands or not based on certain conditions—hence, the conditional row activation. In some embodiments, the memory device makes such determinations based on at which row (e.g., at which address) of the bank the refresh operations are in progress and how the row, to which the incoming ACT command is directed, aligns with respect to the row being refreshed. As described in more detail herein, the determinations are made to prevent corrupting the data being refreshed. If the memory device determines to execute the incoming ACT command, the memory device also generates the indicator signal indicating that the row has been activated. The memory device transmits the indicator signal to the host device via the predetermined pin(s) of the memory device within the predetermined period of time specified in the data sheet. Similarly, if the memory device determines not to execute the incoming ACT command (e.g., to avoid the data corruption during the refresh operations), the memory device generates the indicator signal indicating that the row has not been activated such that the memory device can transmit the indicator signal to the host device.

A memory device that supports embodiments of the present technology is described with reference to FIG. 1. More detailed descriptions of a bank of memory cells that supports embodiments of the present technology are provided with reference to FIGS. 2A and 2B. A memory system including a memory device in accordance with embodiments of the present technology is described with reference to FIG. 3. A method of operating the memory device in accordance with embodiments of the present technology is described with reference to FIG. 4.

FIG. 1 is a block diagram schematically illustrating a memory device 100 in accordance with embodiments of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells (e.g., m×n memory cells) arranged at intersections of the word lines (e.g., m word lines, which may also be referred to as rows) and the bit lines (e.g., n bit lines, which may also be referred to as columns or digit lines). In some embodiments, each bank includes a plurality of sections that each has a group of word lines. The group of word lines within a section may be configured to share sense amplifiers (SAMP) as described in more detail with reference to FIGS. 2A and 2B. In some embodiments, each bit line address (each column address) associated with a particular row may include multiple bit lines (columns) coupled with multiple memory cells—e.g., across multiple banks, via a tiered bit line architecture with local and main/global bit lines.

Memory cells can include any one of a number of different memory media types, including capacitive, phase change, magnetoresistive, ferroelectric, or the like. In some embodiments, a portion of the memory array 150 may be configured to store ECC bits. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least one respective main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI (for data bus inversion function), and DMI (for data mask inversion function), power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140 (which may be referred to as a row driver), and a decoded column address signal (YADD) to the column decoder 145 (which may be referred to as a column driver). The address decoder 110 can also receive the bank address portion of the ADDR input and supply the decoded bank address signal (BADD) and supply the bank address signal to both the row decoder 140 and the column decoder 145.

The command and address terminals may be supplied with command signals CMD, address signals ADDR, and chip select signals CS, from a memory controller. The command signals may represent various memory commands from the memory controller (e.g., refresh commands, activate (ACT) commands, precharge commands, access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105.

The command decoder 115 may include circuits to decode the internal command signals ICMD to generate various internal signals and commands for performing memory operations, for example, a row command signal to select a word line and a column command signal to select a bit line. Other examples of memory operations that the memory device 100 may perform based on decoding the internal command signals ICMD includes a refresh command (e.g., re-establishing full charges stored in individual memory cells of the memory array 150), an activate command (e.g., activating a row in a particular bank), or a precharge command (e.g., deactivating the activated row in the particular bank). The internal command signals can also include output and input activation commands, such as clocked command CMDCK (not shown in FIG. 1).

The command decoder 115, in some embodiments, may further include one or more registers 118 for tracking various counts and/or values (e.g., counts of refresh commands received by the memory device 100 or self-refresh operations performed by the memory device 100) and/or for storing various operating conditions for the memory device 100 to perform certain functions, features, and modes (or test modes). As such, in some embodiments, the registers 118 (or a subset of the registers 118) may be referred to as mode registers. Additionally, or alternatively, the memory device 100 may include registers 118 as a separate component out of the command decoder 115. In some embodiments, the registers 118 may include multi-purpose registers (MPRs) configured to write and/or read specialized data to and/or from the memory device 100.

When a read command is issued to a bank with an open row and a column address is timely supplied as part of the read command, read data can be read from memory cells in the memory array 150 designated by the row address (which may have been provided as part of the activate command identifying the open row) and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (e.g., the register 118). The read latency information RL can be defined in terms of clock cycles of the CK clock signal. For example, the read latency information RL can be a number of clock cycles of the CK signal after the read command is received by the memory device 100 when the associated read data is provided.

When a write command is issued to a bank with an open row and a column address is timely supplied as part of the write command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (e.g., register 118). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VOD, VARY, VPERI, and the like based on the power supply potentials VDD and VSS. The internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command decoder 115.

For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

In some embodiments, the memory device 100 receives an ACT command from a host device coupled with the memory device 100 while the memory device 100 is performing refresh operations for the memory array 150—e.g., in response to receiving a refresh command from the host device. The ACT command includes address information (e.g., XADD, YADD, BADD) such that the memory device 100 can identify a particular word line included in a section of a bank the ACT command is directed to. Subsequently, the memory device 100 may determine whether to activate the particular word line based on the refresh operations currently in progress for the bank. In certain instances, the memory device 100 determines that the particular word line is safe to activate and execute subsequent commands directed to the word line (e.g., read/write commands) without risking corrupting data currently being refreshed for the bank. As such, the memory device 100 may proceed to activate the particular word line and generate a signal (e.g., the indicator signal) indicating that the word line has been activated. In other instances, the memory device 100 may determine that the particular word line is unsafe to activate due to the risk of corrupting data being refreshed. In such instances, the memory device 100 generates the signal to indicate that the particular word line is not activated.

Figure 2A:
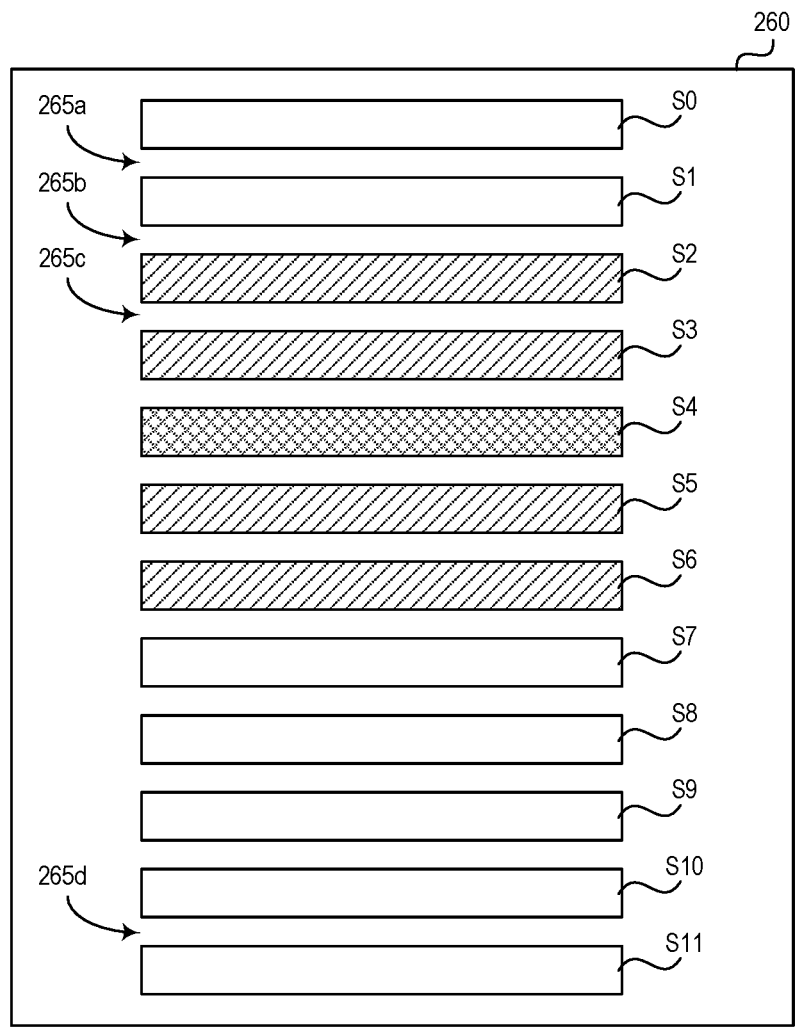
FIG. 2A is a block diagram schematically illustrating a bank of memory cells of a memory device in accordance with embodiments of the present technology.

FIG. 2A is a block diagram schematically illustrating a bank of memory cells of a memory device (e.g., the memory device 100, the memory device 300) in accordance with embodiments of the present technology. FIG. 2A illustrates a bank 260, which may be an example of or include aspects of the banks of the memory array 150 described with reference to FIG. 1. Further, the bank 260 may be configured to include a plurality of sections of memory cells (e.g., sections identified individually as S0 through S11). The bank 260 also includes gaps 265 (also identified individually as 265a through 265d) located between neighboring sections. In some embodiments, sense amplifiers (e.g., the SAMP described with reference to FIG. 1) are located in individual gaps 265 and thus the gaps 265 may be referred to as sense amplifier gaps. In this manner, the bank 260 can be partitioned into sections, and individual sections are coupled to corresponding gaps 265 (e.g., sense amplifiers located in the gaps 265). As such, the sections (e.g., the memory cells within the sections) may be regarded to share the sense amplifiers.

Figure 2B:
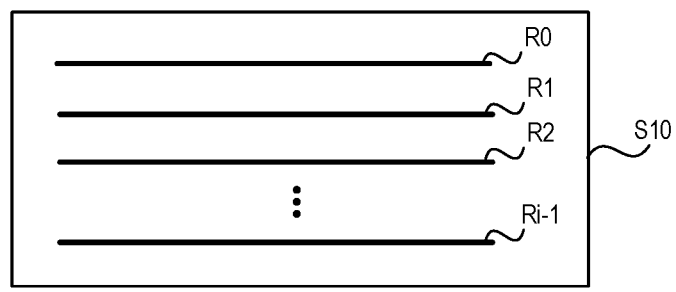
FIG. 2B is a block diagram schematically illustrating a section of the bank of memory cells in accordance with embodiments of the present technology.

FIG. 2B is a block diagram schematically illustrating a section (e.g., the section S10) of the bank 260 in accordance with embodiments of the present technology. The section includes a group of word lines (R0 through Ri−1) depicted to extend in a horizontal direction. Further, the section includes a group of bit lines (not shown) in a generally perpendicular direction with respect to the word lines such that memory cells may be arranged at intersections of the word lines and the bit lines.

Referring back to the bank 260 of FIG. 2A, when the memory device (e.g., the control circuitry 306 of the memory device 300) performs refresh operations for the bank 260, the memory device may utilize an internal counter (e.g., the register 118 as described with reference to FIG. 1) to track which sections (and/or which word lines in individual sections) have been refreshed and which sections remain to be refreshed. For example, if the memory device performs refresh operations for the section S4, the memory device may utilize the internal counter to iterate through each one of the word lines (e.g., R0 through Ri−1) within the section S4 before moving on to the next section (e.g., the section S5) until the memory device completes refresh operations for all the sections within the bank 260.

Further, as the refresh operations include sensing (e.g., using the SAMP) and restoring data for the memory cells coupled with the word lines being refreshed, the memory device may separate (e.g., isolate, set aside, or otherwise prevent from being activated or selected by the column addressing scheme of the memory device) the bit lines associated with the word lines undergoing the refresh operations—e.g., the bit lines associated with the section S4 that is currently being refreshed. In some embodiments, multiple sections within a bank may be configured to share a group of bit lines (e.g., local bit lines).

For example, the bank 260 illustrates that the sections S2 through S6 shares a group of bit lines. As such, while the memory device performs refresh operations for the section S4 and separates the bit lines associated with the section S4 during the refresh operations, activating a row of any one of sections S2, S3, S5, and S6 (and selecting and/or activating columns associated with the sections) would corrupt the data being refreshed for the section S4. Thus, when the memory device refreshes the section S4 (or any one of the sections S2 through S6), activating any row of the sections S2, S3, S5, and S6 to perform memory operations directed thereto would corrupt the data being refreshed for the section S4 because two word lines (one from the section S4 and another from the section S5, for example) are coupled to the shared bit lines between the section S4 and the section S5. Accordingly, if the memory device determines that the incoming ACT command is directed to one of the word lines of the sections sharing the bit lines, the memory device may determine not to execute the incoming ACT command.

The bank 260, however, illustrates that other sections (e.g., sections S0, S1, and S7 through S11) do not share the group of bit lines associated with the sections S2 through S6. As such, activating a row of any one of the sections S0, S1, and S7 through S11 and selecting and/or activating the columns associated with the other sections would not pose corruption risks to the data being refreshed in the section S4. In some embodiments, the memory device may check that a column select (CS) device configured to activate the group of bit lines associated with the sections S2 through S6 is not activated (e.g., floating, decoupled, deactivated, or otherwise disabled) before executing an incoming ACT command directed to the other sections (e.g., sections S0, S1, and S7 through S11). In this manner, the memory device ensures that the data being refreshed (e.g., in the section S4) are free from the data corruption risk if the memory device determines to execute the incoming ACT command directed to the other sections and perform subsequent commands directed thereto. In some embodiments, the column select scheme of the memory device may be segmented such that only a portion of sections within a bank may be activated (or selected) at a time. For example, the columns (bit lines) associated with a first half of sections (e.g., sections S0 through S5) may be selected at a time, but not a second half of sections (e.g., sections S6 through S11), or vice versa, to prevent the risks of data corruption.

Details of internal implementation of the refresh operations may be hidden from a host device coupled to the memory device due to various proprietary reasons. For example, the memory devices may be configured to perform the refresh operations in a particular sequence within a bank—e.g., based on bit patterns of the data stored in each section. In other examples, the memory device may perform other special operations in conjunction with performing refresh operations—e.g., error checking and scrubbing operations. Accordingly, the host device may not know how the refresh operations proceed after issuing the refresh command to the memory device. The present technology, however, allows the host device to issue an ACT command (without knowing which addresses to use to be accepted) during the period of time (e.g., tRFC) after issuing the refresh command, during which the host device is otherwise prohibited to issue any commands directed to the memory array. Subsequently, the host device can monitor one or more predetermined pins of the memory device for a predetermined period of time (e.g., by a parameter determined in the data sheet) to be notified (through the indicator signal) whether the ACT command are accepted (e.g., the row designated by the ACT command is activated) or not.

In some embodiments, the memory device may configure one or more existing pins to provide such notifications to the host device—e.g., transmitting the indicator signal to the host device. For example, the memory device may configure an alert pin (ALERT_n) and/or certain data pins or terminals (e.g., DQ terminals, DQS terminals) to transmit the indicator signal to the host device. In other examples, the memory device may include one or more pins reserved for future use (RFU) that could be configured to transmit the indicator signal to the host device. As the data sheets specify the host device to monitor the indicator signal during a predetermined period of time, the memory device may be configured to transmit the indicator signal within the predetermined period of time via the one or more pins. If the host device receives the indicator signal indicating that the ACT command is accepted (e.g., the word line included in the ACT command has been activated), then the host device may issue one or more commands directed to the word line that has been activated.

Although in the foregoing example embodiments, the memory device is described and illustrated to perform refresh operations in response to receiving a refresh command from the host device, the present technology is not limited thereto. For example, the memory device may initiate the refresh operations on its own (e.g., self-refresh, auto-refresh) without receiving an external command and the present technology may facilitate the memory device to accommodate access commands during such self-initiated refresh operations. Further, the present technology not limited to the DRAM technology and may be applied to various memory technologies that require periodic restoration of data written to the memory cells—e.g., refreshes for the DRAM technology.

Figure 3:
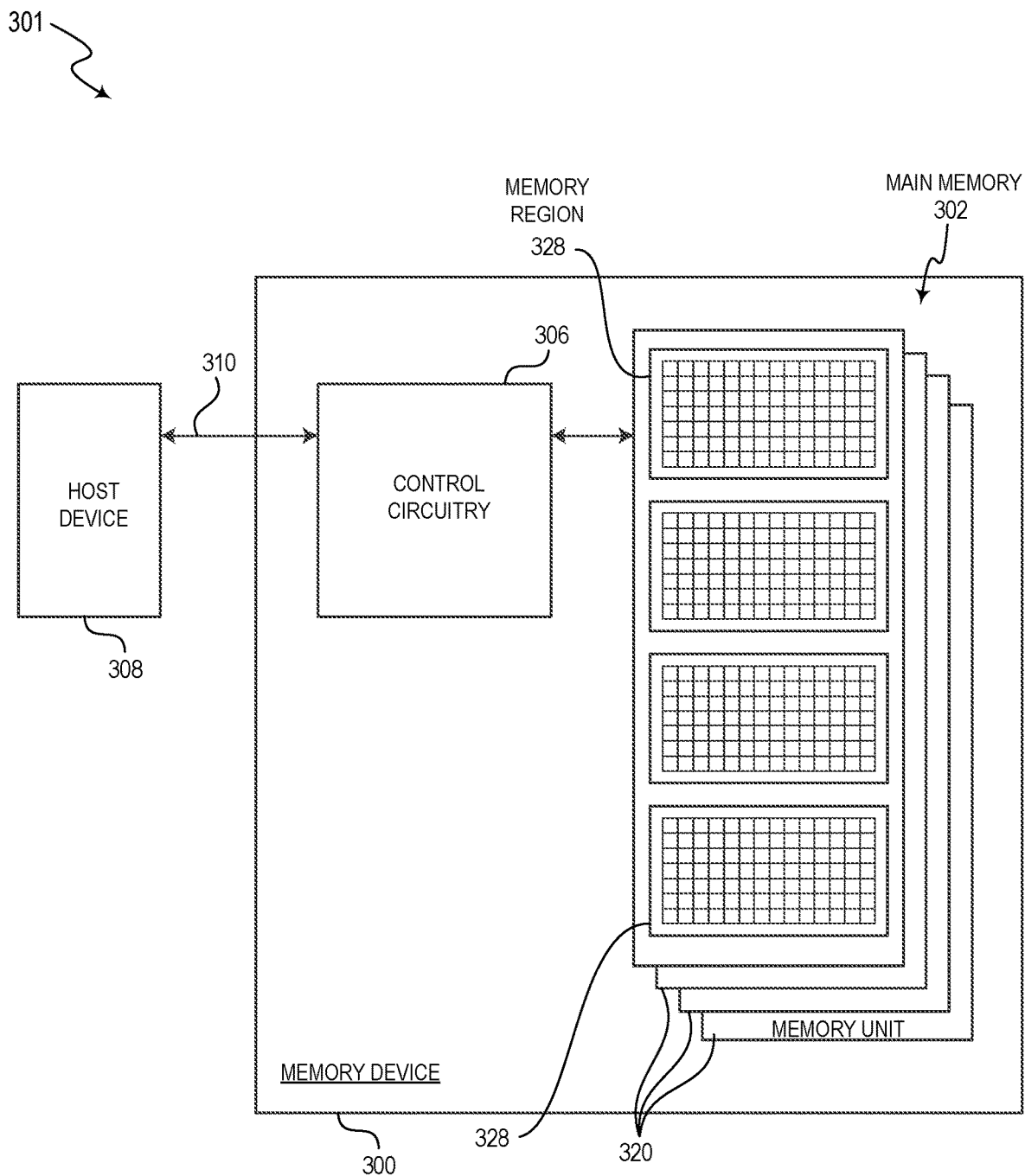
FIG. 3 is a block diagram of a system having a memory device configured in accordance with embodiments of the present technology.

FIG. 3 is a block diagram of a system 301 having a memory device 300 configured in accordance with embodiments of the present technology. The memory device 300 may be an example of or include aspects of the memory device (e.g., the memory device 100) described with reference to FIGS. 1 through 2B. As shown, the memory device 300 includes a main memory 302 (e.g., DRAM, NAND flash, NOR flash, FeRAM, PCM, etc.) and control circuitry 306 operably coupled to a host device 308 (e.g., an upstream central processor (CPU), a memory controller). The control circuitry 306 may include aspects of various components described with reference to FIGS. 1 through 2B. For example, the control circuitry 306 may include aspects of the command/address input circuit 105, the address decoder 110, the command decoder 115, the row decoder 140, the column decoder 145, among others. Further, the control circuitry 306 may perform various operations described above with reference to FIGS. 2A and 2B.

The main memory 302 includes a plurality of memory units 320, which each include a plurality of memory cells. The memory units 320 can be individual memory dies, memory planes in a single memory die, a stack of memory dies vertically connected with through-silicon vias (TSVs), or the like. For example, in one embodiment, each of the memory units 320 can be formed from a semiconductor die and arranged with other memory unit dies in a single device package. In other embodiments, multiple memory units 320 can be co-located on a single die and/or distributed across multiple device packages. The memory units 320 may, in some embodiments, also be sub-divided into memory regions 328 (e.g., banks, ranks, channels, blocks, pages, etc.).

The memory cells can include, for example, floating gate, charge trap, phase change, capacitive, ferroelectric, magnetoresistive, and/or other suitable storage elements configured to store data persistently or semi-persistently. The main memory 302 and/or the individual memory units 320 can also include other circuit components, such as multiplexers, decoders, buffers, read/write drivers, address registers, data out/data in registers, etc., for accessing and/or programming (e.g., writing) the memory cells and other function, such as for processing information and/or communicating with the control circuitry 306 or the host device 308. Although shown in the illustrated embodiments with a certain number of memory cells, rows, columns, regions, and memory units for purposes of illustration, the number of memory cells, rows, columns, regions, and memory units can vary, and can, in other embodiments, be larger or smaller in scale than shown in the illustrated examples. For example, in some embodiments, the memory device 300 can include only one memory unit 320. Alternatively, the memory device 300 can include two, three, four, eight, ten, or more (e.g., 16, 32, 64, or more) memory units 320. Although the memory units 320 are shown in FIG. 3 as including four memory regions 328 each, in other embodiments, each memory unit 320 can include one, two, three, eight, or more (e.g., 16, 32, 64, 100, 128, 256, or more) memory regions.

In one embodiment, the control circuitry 306 can be provided on the same die as the main memory 302 (e.g., including command/address/clock input circuitry, decoders, voltage and timing generators, input/output circuitry, etc.). In another embodiment, the control circuitry 306 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 306 can include a processor configured to execute instructions stored in memory to perform various processes, logic flows, and routines for controlling operation of the memory device 300, including managing the main memory 302 and handling communications between the memory device 300 and the host device 308. In some embodiments, the control circuitry 306 can include embedded memory with memory registers for storing, e.g., memory addresses, row counters, bank counters, memory pointers, fetched data, etc. In another embodiment of the present technology, a memory device 300 may not include control circuitry, and may instead rely upon external control (e.g., provided by the host device 308, or by a processor or controller separate from the memory device 300).

The host device 308 can be any one of a number of electronic devices capable of utilizing memory for the temporary or persistent storage of information, or a component thereof. For example, the host device 308 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 308 may be a networking device (e.g., a switch, a router, etc.) or a recorder of digital images, audio and/or video, a vehicle, an appliance, a toy, or any one of a number of other products. In one embodiment, the host device 308 may be connected directly to memory device 300, although in other embodiments, the host device 308 may be indirectly connected to memory device (e.g., over a networked connection or through intermediary devices).

In operation, the control circuitry 306 can directly write or otherwise program (e.g., erase) the various memory regions of the main memory 302. The control circuitry 306 communicates with the host device 308 over a host-device bus or interface 310. In some embodiments, the host device 308 and the control circuitry 306 can communicate over a dedicated memory bus (e.g., a DRAM bus). In other embodiments, the host device 308 and the control circuitry 306 can communicate over a serial interface, such as a serial attached SCSI (SAS), a serial AT attachment (SATA) interface, a peripheral component interconnect express (PCIe), or other suitable interface (e.g., a parallel interface). The host device 308 can send various requests (in the form of, e.g., a packet or stream of packets) to the control circuitry 306. A request can include a command to read, write, erase, return information, and/or to perform a particular operation (e.g., a refresh operation, a TRIM operation, a precharge operation, an activate operation, a wear-leveling operation, a garbage collection operation, etc.).

In some embodiments, the memory device 300 includes a bank of memory cells. The bank may include a plurality of sections that each has a group of word lines. Further, the memory device 300 may include circuitry (e.g., the control circuitry 306) configured to receive an activate (ACT) command directed to a first section of the plurality of sections concurrently with a refresh operation in progress for the bank, determine, in response to receiving the ACT command, whether to activate a first word line of the group of word lines of the first section, and generate a signal indicating whether the first word line is activated or not. In some embodiments, the host device 308 is configured to monitor the signal for a predetermined period of time after transmitting the ACT command to the memory device. Further, the host device 308 can be configured to transmit an access command directed to the first word line if the signal indicates that the first word line is activated.

Figure 4:
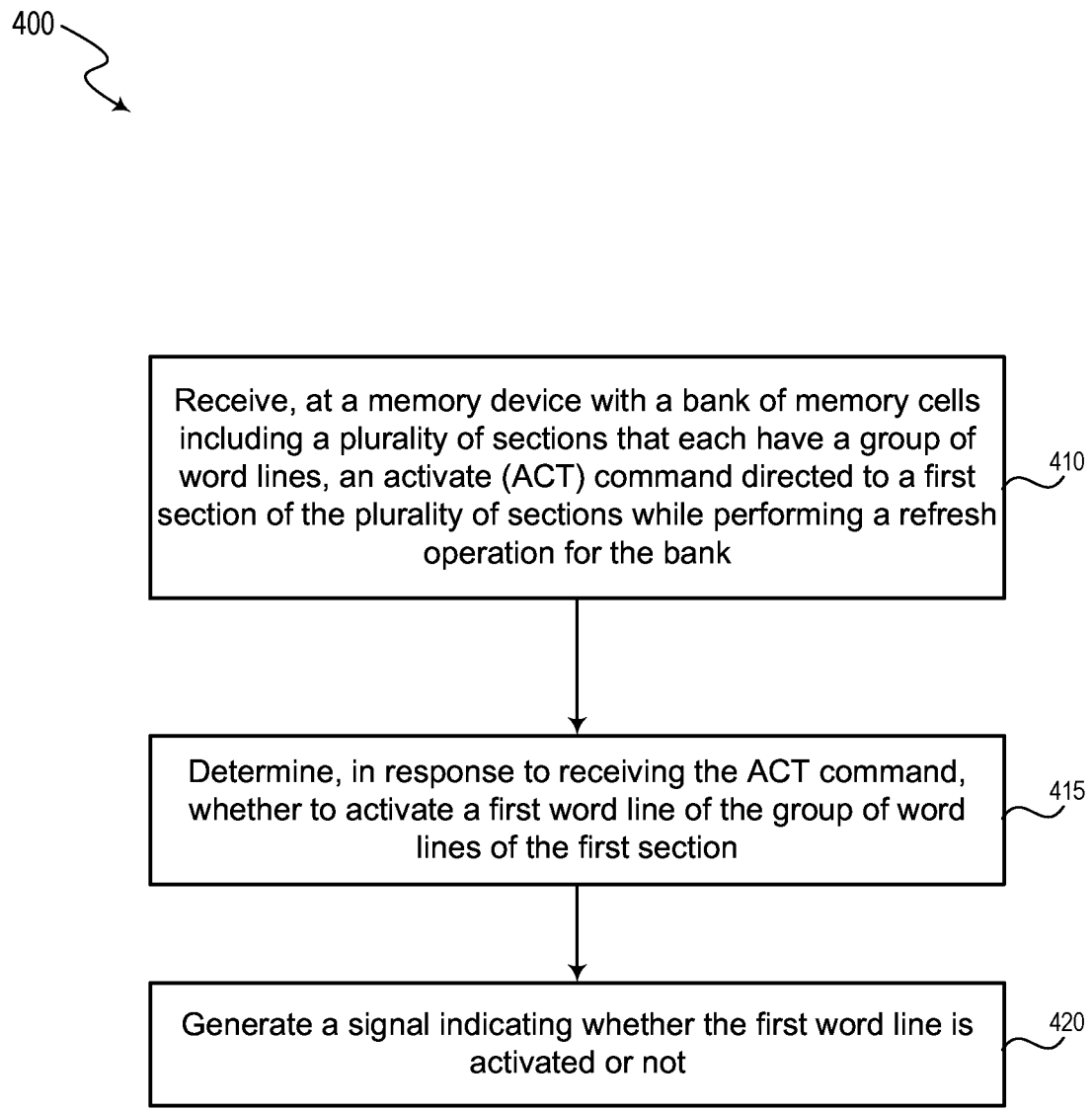
FIG. 4 is a flowchart illustrating a method of operating a memory device in accordance with embodiments of the present technology.

FIG. 4 is a flow chart 400 illustrating a method of operating a memory device (e.g., the memory device 100) in accordance with embodiments of the present technology. The flow chart 400 may be an example of or include aspects of a method that the memory device (e.g., the control circuitry 306) may perform as described with reference to FIGS. 1 through 3.

The method includes receiving, at a memory device with a bank of memory cells including a plurality of sections that each has a group of word lines, an activate (ACT) command directed to a first section of the plurality of sections while performing a refresh operation for the bank (box 410). In accordance with one aspect of the present technology, the receiving feature of box 410 can be performed by the control circuitry 306, as described with reference to FIGS. 1 through 3.

The method further includes determining, in response to receiving the ACT command, whether to activate a first word line of the group of word lines of the first section (box 415). In accordance with one aspect of the present technology, the determining feature of box 415 can be performed by the control circuitry 306, as described with reference to FIGS. 1 through 3.

The method further includes generating a signal indicating whether the first word line is activated or not (box 420). In accordance with one aspect of the present technology, the generating feature of box 420 can be performed by the control circuitry 306, as described with reference to FIGS. 1 through 3.

In some embodiments, the memory device performs the refresh operation in response to receiving a refresh command prior to receiving the ACT command. In some embodiments, the method can further include determining that the refresh operation is directed to a second section of the plurality of sections, the second section different than the first section. In some embodiments, the method can further include activating the first word line of the first section in response to determining that the refresh operation is directed to the second section, and generating the signal to indicate that the first word line of the first section is activated.

In some embodiments, the method can further include performing an operation in response to an access command directed to the first word line if the memory device determines to activate the first word line of the first section. In some embodiments, the method can further include configuring at least one of an alert pin, a data pin, or a pin of the memory device for transmitting the signal to a host device coupled with the memory device. In some embodiments, the method can further include transmitting the signal to a host device coupled with the memory device within a predetermined period of time after receiving the ACT command.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus, comprising:
    at least one bank of memory cells, wherein each bank includes a plurality of sections that each has a group of word lines; and
    circuitry configured to:
        receive an activate (ACT) command directed to a first section of the plurality of sections concurrently with a refresh operation in progress for a same bank of the at least one bank of memory cells;
        determine, in response to receiving the ACT command, whether to activate a first word line of the group of word lines of the first section based on whether the refresh operation is directed to the first section; and
        generate a signal indicating whether the first word line has been activated or not.

2. The apparatus of claim 1, wherein the refresh operation in progress is based on a refresh command received prior to receiving the ACT command.

3. The apparatus of claim 1, wherein the circuitry is further configured to:
    determine that the refresh operation is in progress for a second section of the plurality of sections, the second section different than the first section.

4. The apparatus of claim 3, wherein the circuitry is further configured to:
    activate the first word line of the first section, in response to determining that the refresh operation is in progress for the second section; and
    generate the signal to indicate that the first word line of the first section is activated.

5. The apparatus of claim 3, wherein the first section is not coupled to bit lines that are associated with the second section during the refresh operation.

6. The apparatus of claim 3, wherein the bank includes a third section of the plurality of sections, the third section different than the first and second sections and coupled to bit lines that are associated with the second section during the refresh operation.

7. The apparatus of claim 1, wherein the circuitry is further configured to:
    perform an operation in response to an access command directed to the first word line if the circuitry determines to activate the first word line of the first section.

8. The apparatus of claim 1, wherein the apparatus includes at least one of an alert pin, a data pin, or a pin, and the circuitry is further configured to:
    configure at least one of the alert pin, the data pin, or the pin to transmit the signal to a host device coupled with the apparatus.

9. The apparatus of claim 1, wherein the circuitry is further configured to:
    transmit, in response to receiving the ACT command, the signal to a host device coupled with the apparatus within a predetermined period of time.

10. The apparatus of claim 1, wherein the memory cells of the bank include dynamic random-access memory (DRAM) cells.

11. A method, comprising:
    receiving, at a memory device having at least one bank of memory cells with each bank including a plurality of sections that each has a group of word lines, an activate (ACT) command directed to a first section of the plurality of sections while performing a refresh operation for same bank of the at least one bank of memory cells;
    determining, in response to receiving the ACT command, whether to activate a first word line of the group of word lines of the first section based on whether the refresh operation is directed to the first section; and
    generating a signal indicating whether the first word line has been activated or not.

12. The method of claim 11, wherein the memory device performs the refresh operation in response to receiving a refresh command prior to receiving the ACT command.

13. The method of claim 11, further comprising:
    determining that the refresh operation is directed to a second section of the plurality of sections, the second section different than the first section.

14. The method of claim 13, further comprising:
    activating the first word line of the first section in response to determining that the refresh operation is directed to the second section; and
    generating the signal to indicate that the first word line of the first section is activated.

15. The method of claim 11, further comprising:
    performing an operation in response to an access command directed to the first word line if the memory device determines to activate the first word line of the first section.

16. The method of claim 11, further comprising:
    configuring at least one of an alert pin, a data pin, or a pin of the memory device for transmitting the signal to a host device coupled with the memory device.

17. The method of claim 11, further comprising:
    transmitting the signal to a host device coupled with the memory device within a predetermined period of time after receiving the ACT command.

18. A system, comprising:
    a host device; and
    a memory device coupled with the host device, the memory device including:
        at least one bank of memory cells, each bank with a plurality of sections that each has a group of word lines; and
        circuitry configured to:
            receive an activate (ACT) command directed to a first section of the plurality of sections concurrently with a refresh operation in progress for same bank of the at least one bank of memory cells;

determine, in response to receiving the ACT command, whether to activate a first word line of the group of word lines of the first section based on whether the refresh operation is directed to the first section; and generate a signal indicating whether the first word line i-s has been activated or not.

19. The system of claim 18, wherein the host device is configured to:

monitor the signal for a predetermined period of time after transmitting the ACT command to the memory device.

20. The system of claim 18, wherein the host device is configured to:

transmit an access command directed to the first word line if the signal indicates that the first word line is activated.

* * * * *